United States Patent [19]

Lu

[11] Patent Number: 5,729,124
[45] Date of Patent: Mar. 17, 1998

[54] ESTIMATION OF SIGNAL FREQUENCY USING FAST WALSH TRANSFORM

[75] Inventor: Chun-Chian Lu, Hsinwu Taoyuan, Taiwan

[73] Assignee: Industrial Technology Research Institute, Hsin-Chu, Taiwan

[21] Appl. No.: 209,962

[22] Filed: Mar. 14, 1994

[51] Int. Cl.$^6$ .................................. G06F 15/332
[52] U.S. Cl. .................. 324/76.24; 364/726; 364/727
[58] Field of Search ........................ 324/76.24, 76.42; 364/726, 727

[56] References Cited

U.S. PATENT DOCUMENTS

| | | | |
|---|---|---|---|
| 4,133,606 | 1/1979 | Hosoe et al. | 354/25 |
| 5,253,192 | 10/1993 | Tufts | 364/726 |

OTHER PUBLICATIONS

Ferrel Sandy 1969 Walsh Functions Symposium.
Walsh–Hademard Transformation of Television Picks Clarke et al. 1973.
Griffiths The Use of Walsh Functions in Design of Optimum Radar Waveforms 1974.

*Primary Examiner*—Maura K. Regan
*Attorney, Agent, or Firm*—Meltzer, Lippe, Goldstein, Wolf & Schlissel, P.C.

[57] ABSTRACT

A method of frequency estimation is disclosed which uses a Fast Walsh Transform (FWT) in place of a conventional Fast Fourier Transform (FFT) technique. The inventive method is based on a linear relationship between the unknown signal frequency and the sequency of a Walsh function which corresponds to the sample of the FWT with maximum absolute value. The resulting discrete data is smoothed mathematically by a sequency interpolation process, which improves resolution and accuracy. The disclosed FWT method provides greater speed and simpler implementation than the prior FFT technique, since the FWT method follows one simple repetitive data flow pattern (additions only), while the FFT technique follows more complicated butterfly patterns (multiplications and additions).

4 Claims, 6 Drawing Sheets

ESTIMATION OF SIGNAL FREQUENCY USING FAST WALSH TRANSFORM

FIELD OF THE INVENTION

The present invention relates to a method and circuit for estimating the frequency of a signal utilizing a Fast Walsh Transform process.

BACKGROUND OF THE INVENTION

The ability to rapidly identify the frequency characteristics of an unknown signal is critical to certain applications, such as a Code Division Multiple Access (CDMA) cordless phone system. A prior method of frequency estimation uses the Fast Fourier Transform (FFT) algorithm. This process requires (PN/2) multiplications and (PN) additions, where N=Dimension of the Transform P=Log(Base2) N Disadvantages of this technique are (1) limitation of speed, and (2) difficulty in implementation; both due to the complexity of the multiplication process.

The present invention eliminates the need for multiplications altogether, through the use of the Fast Walsh Transform (FWT) algorithm, in place of the more traditional FFT method.

See e.g. the following references: 1. Good, I. J., "The Interaction Algorithm and Practical Fourier Analysis", J. Roy. Statist. Soc. (London), Vol. B20, 1958. 2. U.S. Pat. No. 3,879,685; Carl, J. W. et al, "Special Purpose Hybrid Computer to implement Kroneker Matrix Transformation". 3. U.S. Pat. No. 3,956,619; Mundy, J. L. et al, "Pipeline Walsh-Hadamard Transformation". 4. Beauchamp, K. G., "Walsh Functions and their Applications", Techniques of Physics, Ed. G. K. T. Conn and H. N. Daglish, 1977. 5. Beauchamp, K. G., "Applications of Walsh and Related Functions", Academic Press, New York, New York 1984. 6. U.S. Pat. Nos. 4,904,930 Method of Carrier Frequency Estimation; 4,983,906 Frequency Estimation System; 4,941,155 Method and Circuitry for Symbol Timing and Frequency Offset Estimation; 4,901,150 Automatic Noise Reduction for Individual Frequency Components of a Signal; 4,827,225 Fast Locking Phase-Lock Loop utilizing Frequency Estimation; 5,151,926 Sample Timing and Carrier Frequency Estimation Circuit for Sine-Cosine Detectors; 5,077,531 PSK Signal Demodulation System; 4,956,838 Echo Cancelling Device with Frequency Sub-Band Filtering; 5,165,051 Modified Fast Frequency Acquisition via Adaptive Least Square Algorithm; 5,148,489 Method for Spectral Estimation to Improve Noise Robustness for Speech.

Additionally, an interpolative technique is applied to the FWT process to enhance the resolution and accuracy of frequency estimation.

Thus, the objects of the present invention are:

(1) Increase the speed of frequency estimation of an unknown signal over prior FFT methods;

(2) Simplify the implementation of the frequency estimation process;

(3) Improve the resolution and accuracy of this frequency estimation through data interpolation.

SUMMARY OF THE INVENTION

The present invention includes a method for estimating an unknown signal frequency, and the circuitry for implementation of this frequency estimation process. The inventive method comprises the steps of obtaining N samples an input signal, with a sampling interval Ts, while insuring that the number of peaks and valleys in the obtained samples is less than or equal to N. Then, a Fast Walsh Transform (FWT) is applied to these samples. The sequency (number of polarity changes) of the Walsh function resulting in the FWT sample with the maximal absolute value is identified. Then the frequency of the input signal is computed, using, for example, a linear relationship between this frequency and the sequency of the Walsh function resulting in the FWT sample with a maximal absolute value.

The present invention replaces the FFT method with a more efficient algorithm, based on the Fast Walsh Transform (FWT). In the inventive method, no multiplications are required, and the total number of operations is equal to PN. Thus, the speed of frequency estimation is increased through the use of fewer, simpler operational steps; that is, (PN) additions for FWT, vs. (PN) additions+(PN/2) multiplications for FFT.

To enhance both the resolution and accuracy of this FWT method, an interpolation process is disclosed, identified as "sequency interpolation". This process mathematically smooths the discrete data points derived from the disclosed method.

The present invention's advantages (speed, simplicity, accuracy) over the prior art can improve the performance and reduce the cost of frequency-acquisition devices, such as the cordless phone or any type of spread spectrum receiver.

DETAILED DESCRIPTION OF THE INVENTION

This invention utilizes the extraction of orthogonal transform coefficients from sequences of serially presented data through the use of Walsh functions, which are especially useful for the representation of binary functions having values of +1 and −1 in the unit interval. The sequency (S) of a Walsh function is defined herein as the number of times the value of the Walsh function changes sign within the unit interval.

A series of Walsh functions may be expressed in a matrix known as a Hadamard matrix, in which elements are either +1 or −1, and in which the respective row vectors and the respective column vectors are mutually orthogonal. The values of the elements in each row or column of a Hadamard matrix represent the values of a Walsh function over sequential segments of the unit interval.

The Walsh/Hadamard transformation makes it possible to pass from one sequence of samples designated $X_1 \ldots X_i \ldots X_n$ to a sequence of transformed samples designated $Y_1 \ldots Y_j \ldots Y_n$ by the following linear relation:

$$\begin{bmatrix} Y_1 \\ Y_j \\ Y_n \end{bmatrix} = H. \begin{bmatrix} X_1 \\ X_i \\ X_n \end{bmatrix}$$

in which H is a Hadamard matrix of dimension N. For example the transformation operative on sequences of four samples is written:

$$\begin{bmatrix} Y_1 \\ Y_2 \\ Y_3 \\ Y_4 \end{bmatrix} = \begin{bmatrix} +1 & +1 & +1 & +1 \\ +1 & +1 & -1 & -1 \\ +1 & -1 & -1 & +1 \\ +1 & -1 & +1 & -1 \end{bmatrix} \begin{bmatrix} X_1 \\ X_2 \\ X_3 \\ X_4 \end{bmatrix}$$

which is equivalent to the following four relations:

$Y_1 = X_1 + X_2 + X_3 + X_4$ $Y_2 = X_1 + X_2 - X_3 - X_4$ $Y_3 = X_1 - X_2 - X_3 + X_4$ $Y_4 = X_1 - X_2 + X_3 - X_4$

The present invention is based on a linear relationship between the frequency of a signal and the sequency of the particular Walsh function in the Hadamard matrix which results in the transformed sample $Y_n$ with the greatest absolute value. This relationship can be proven using the general waveform functions of $\sin(n\pi x)$ and $\cos(n\pi x)$, from $x = -1$ to $x = +1$.

For illustration, the waveforms $\sin(\pi x)$, $\sin(2\pi x)$, $\cos(\pi x)$, $\cos(2\pi x)$ will be used (FIGS. 1a, 1b, 1c, 1d, respectively). The minimum number of samples (N) required to encompass all the peaks and valleys of these waveforms are shown, along with their corresponding sampling intervals (Ts).

Figure 1A:
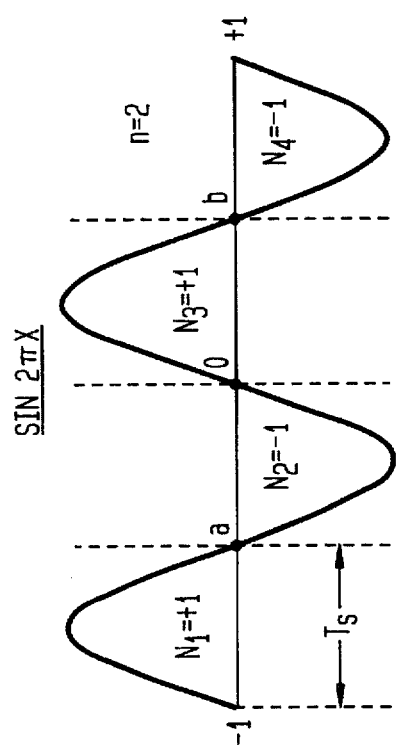
FIG. 1a illustrates a $\sin(\pi x)$ waveform which has been sampled to obtain N=2 samples.

In FIG. 1a, the waveform of $\sin(\pi x)$ is sampled 2 times with sampling interval $T_s$ to obtain samples $N_1 = 1, N_2 = 1$. The sequency of this waveform (number of zero crossings) is 1 (at point 0), which is in agreement with the general expression for sine wave sequency. That is, sequency (S) of $\sin(n\pi x)$ is $(2n-1)$. In FIG. 1a, $n = 1$; therefore, $S = (2n-1) = 1$.

Figure 1B:
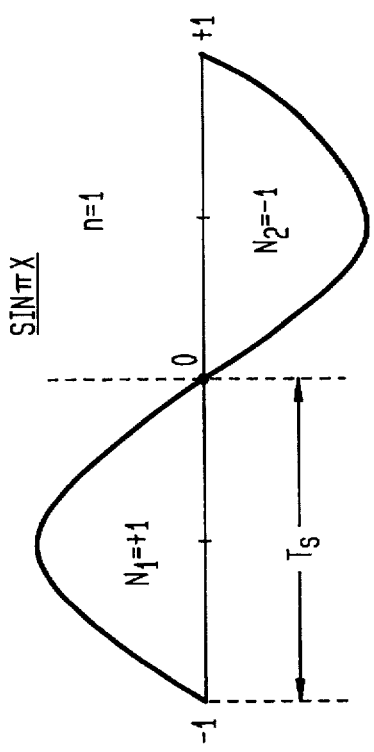
FIG. 1b illustrates a $\sin(2\pi x)$ waveform which has been sampled to obtain N=4 samples.

In FIG. 1b, the waveform of $\sin(2\pi x)$ is sampled 4 times with sampling interval Ts to obtain samples ($N_1 = 1, N_2 = -1, N_3 = 1, N_4 = 1$). The sequency (number of zero crossings) of this waveform is 3 (points a,0,b), which is also in agreement with $S = (2n-1)$, since $n = 2$.

Figure 1C:
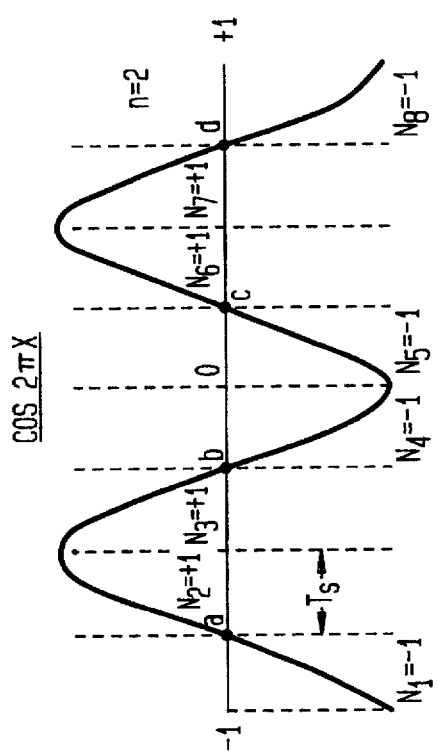
FIG. 1c illustrates a $\cos(\pi x)$ waveform which has been sampled to obtain N=4 samples.

In FIG. 1c, the waveform of $\cos(\pi x)$ is sampled 4 times with sampling interval Ts ($N_1 = -1, N_2 = +1, N_3 = +1, N_4 = -1$). The sequency (number of zero crossings) of this waveform is 2 (points a and b), which is in agreement with the general expression for cosine wave sequency. That is, sequency (S) of $\cos(n\pi x)$ is $2n$. In FIG. 1c, $n = 1$; therefore, $S = 2n = 2$.

Figure 1D:
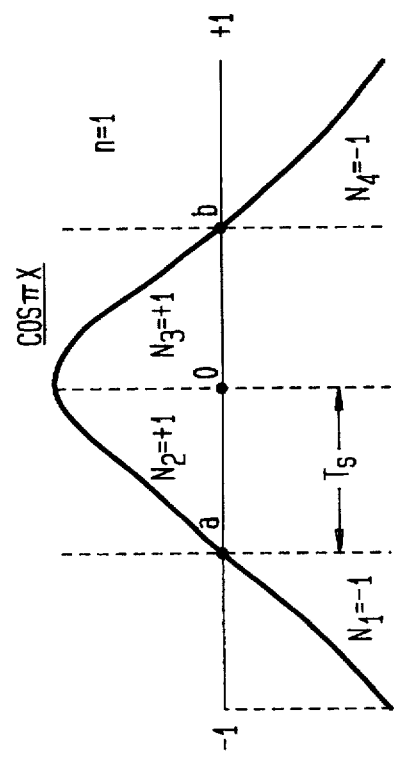
FIG. 1d illustrates a $\cos(2\pi x)$ waveform which has been sampled to obtain N=8 samples.
Figure 2:
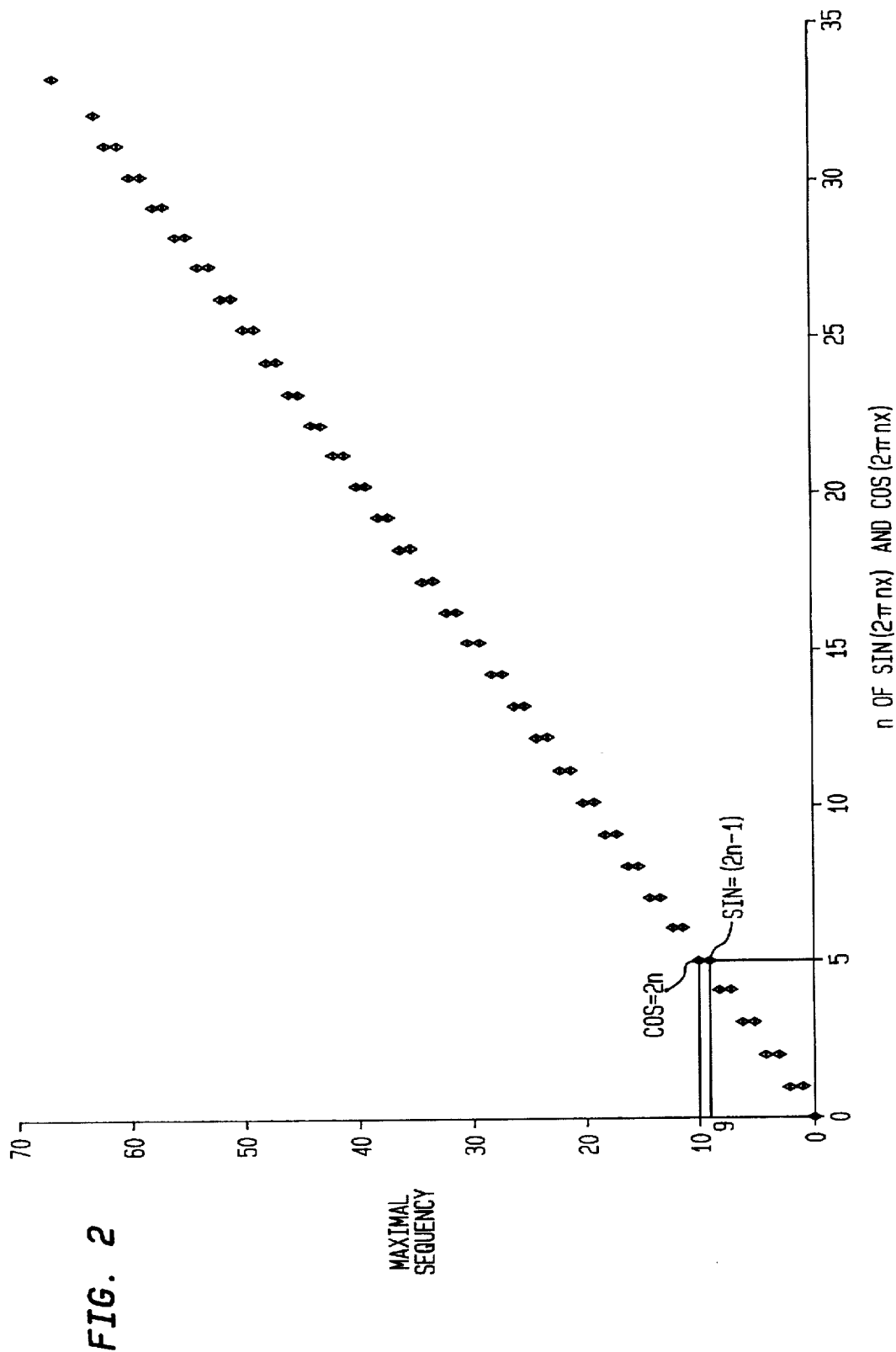
FIG. 2 graphically illustrates the relationship of FWT sequency versus the order of sine and cosine functions.

In FIG. 1d, the waveform of $\cos(2\pi x)$ is sampled 8 times with sampling interval $Ts(N_1 = -1, N_2 = +1, N_3 = +1, N_4 = -1, N_5 = -1, N_6 = +1, N_7 = +1, N_8 = -1)$. The sequency of this waveform is $S = 4$ (points a, b, c, d), which is also in agreement with $S = 2n$, since $n = 2$.

To develop the relationship between the sine and cosine waveforms and their corresponding Walsh transforms, it is necessary to operate on the aforementioned samples ($N_1, N_2 \ldots$) by multiplication with a matrix of Walsh functions of the same order.

It is a key premise of this invention that a general relationship exists between the sequency of a sine or cosine waveform and its corresponding Walsh transform. That is, the sequency of the Walsh function in the Hadamard matrix which results in the transform sample of maximum absolute value is equal to the sequency of the $\sin(n\pi x)$ or $\cos(n\pi x)$ waveform.

The following examples will illustrate this relationship.

EXAMPLE (1)

In FIG. 1a ($\sin(\pi x)$), the samples are $N_3 = +1$ and $N_2 = -1$.

An FWT of these samples takes the following form of matrix multiplication:

$$\begin{bmatrix} Y_1 \\ Y_2 \end{bmatrix} = \begin{bmatrix} 1 & 1 \\ 1 & -1 \end{bmatrix} \begin{bmatrix} N_1 \\ N_2 \end{bmatrix}$$

which in this case reduce to $$\begin{bmatrix} Y_1 \\ Y_2 \end{bmatrix} = \begin{bmatrix} 0 \\ 2 \end{bmatrix}$$

The maximum transform sample is 2 and the Walsh function which results in this transform component is (1, -1) i.e. the second row of the Hadamard matrix which has a sequency of $S = 1$.

This sequency is equal to the sequency of $\sin(\pi x)$, as described above.

EXAMPLE (2)

In FIG. 1b ($\sin(2\pi x)$), the samples are $N_1 = +1, N_2 = -1, N_3 = +1, N_4 = -1$.

The FWT matrix multiplication is as follows:

$$\begin{bmatrix} Y_1 \\ Y_2 \\ Y_3 \\ Y_4 \end{bmatrix} = \begin{bmatrix} +1 & +1 & +1 & +1 \\ +1 & +1 & -1 & -1 \\ +1 & -1 & -1 & +1 \\ +1 & -1 & +1 & -1 \end{bmatrix} * \begin{bmatrix} N_1 \\ N_2 \\ N_3 \\ N_4 \end{bmatrix} = \begin{bmatrix} 0 \\ 0 \\ 0 \\ 4 \end{bmatrix}$$

Therefore, the maximal FWT sample is $Y_4 = 4$. The Walsh function which resulted in this maximal FWT sample is $(+1, -1, +1, -1)$ with a sequency $S = 3$.

This sequency is equal to the sequency of $\sin(2\pi x)$, as described above.

EXAMPLE (3)

In similar fashion, the waveform in FIG. 1c ($\cos(\pi x)$) yields the following matrix multiplication:

$$\begin{bmatrix} Y_1 \\ Y_2 \\ Y_3 \\ Y_4 \end{bmatrix} = \begin{bmatrix} +1 & +1 & +1 & +1 \\ +1 & +1 & -1 & -1 \\ +1 & -1 & -1 & +1 \\ +1 & -1 & +1 & -1 \end{bmatrix} * \begin{bmatrix} -1 \\ +1 \\ +1 \\ -1 \end{bmatrix} = \begin{bmatrix} 0 \\ 0 \\ -4 \\ 0 \end{bmatrix}$$

The transformed sample with maximum absolute value is $Y_3 = -4$. The Walsh function which results in this transformed sample is $(+1, -1, -1, +1)$, i.e. the Walsh function in the third row of the Hadamard matrix, with a sequency $S = 2$. This is the correct sequency for $\cos(\pi x)$ as indicated above.

EXAMPLE (4)

In FIG. 1d ($\cos 2\pi x$), the samples are $N_1 = -1, N_2 = +1, N_3 = +1, N_4 = -1, N5_5 = -1, N_6 = +1, N_7 = +1, N_8 = -1$. The following matrix multiplication is used to obtain an eighth order FWT.

$$\begin{bmatrix} Y_1 \\ Y_2 \\ Y_3 \\ Y_4 \\ Y_5 \\ Y_6 \\ Y_7 \\ Y_8 \end{bmatrix} = \begin{bmatrix} +1 & +1 & +1 & +1 & +1 & +1 & +1 & +1 \\ +1 & +1 & +1 & +1 & -1 & -1 & -1 & -1 \\ +1 & +1 & -1 & -1 & -1 & -1 & +1 & +1 \\ +1 & +1 & -1 & -1 & +1 & +1 & -1 & -1 \\ +1 & -1 & -1 & +1 & +1 & -1 & -1 & +1 \\ +1 & -1 & -1 & +1 & -1 & +1 & +1 & -1 \\ +1 & -1 & +1 & -1 & -1 & +1 & -1 & +1 \\ +1 & -1 & +1 & -1 & +1 & -1 & +1 & -1 \end{bmatrix} * \begin{bmatrix} N_1 \\ N_2 \\ N_3 \\ N_4 \\ N_5 \\ N_6 \\ N_7 \\ N_8 \end{bmatrix} = \begin{bmatrix} 0 \\ 0 \\ 0 \\ 0 \\ -8 \\ 0 \\ 0 \\ 0 \end{bmatrix}$$

Therefore, the maximal FWT component is $Y_5$. The Walsh function which resulted in this sequency is the fifth row of the FWT matrix and has sequency of S=4.

This sequency is equal to the sequency of $\cos(2\pi x)$, as described above.

Thus, the sequency of the Walsh function which results in the maximal FWT sample value is shown to be equal to the sequency of $\sin(n\pi x)$ and $\cos(n\pi x)$.

The total phase of $\cos(n\pi x)$ in the maximal integral $$\int_{-1}^{+1} Wm\cos(n\pi x)dx = \int_{-1}^{+1} k\cos(n\pi x)dx$$

is related to the frequency (f) by $2\pi n = 2\pi f NTs$ where Wm is the Walsh function which maximizes the integral N=number of samples (Walsh dimension)
2n=sequency of $\cos(n\pi x)$
Ts=sampling interval
f=frequency of sine or cosine wave
Therefore, $$f = \frac{\text{maximal sequency}}{2NTs} \quad \text{(Equation 1)}$$

Further analysis of the sequency of sine and cosine functions and the minimum Walsh dimension ($N_{min}$) required to represent those functions (see Table 1) reveals the following equation to be more generally accurate, especially at the higher sequencies:

$$f = \frac{\text{maximal sequency}}{2(N-1)Ts} \quad \text{(Equation 2)}$$

TABLE 1

| | sequency | Nmin | real f | f Eq(1) | error | f Eq(2) | error |
|---|---|---|---|---|---|---|---|
| sinπx | 1 | 2 | 1/2Ts | 1/4Ts | 1/4Ts | 1/2Ts | 0 |
| cosπx | 2 | 4 | 1/4Ts | 1/4Ts | 0 | 1/3Ts | 1/12Ts |
| sin2πx | 3 | 4 | 1/2Ts | 3/8Ts | 1/8Ts | 1/2Ts | 0 |
| cos2πx | 4 | 8 | 1/4Ts | 1/4Ts | 0 | 2/7Ts | 1/28Ts |
| sin4πx | 7 | 8 | 1/2Ts | 7/16Ts | 1/16Ts | 1/2Ts | 0 |
| cos4πx | 8 | 16 | 1/4Ts | 1/4Ts | 0 | 4/15Ts | 1/60Ts |

Figure 3:
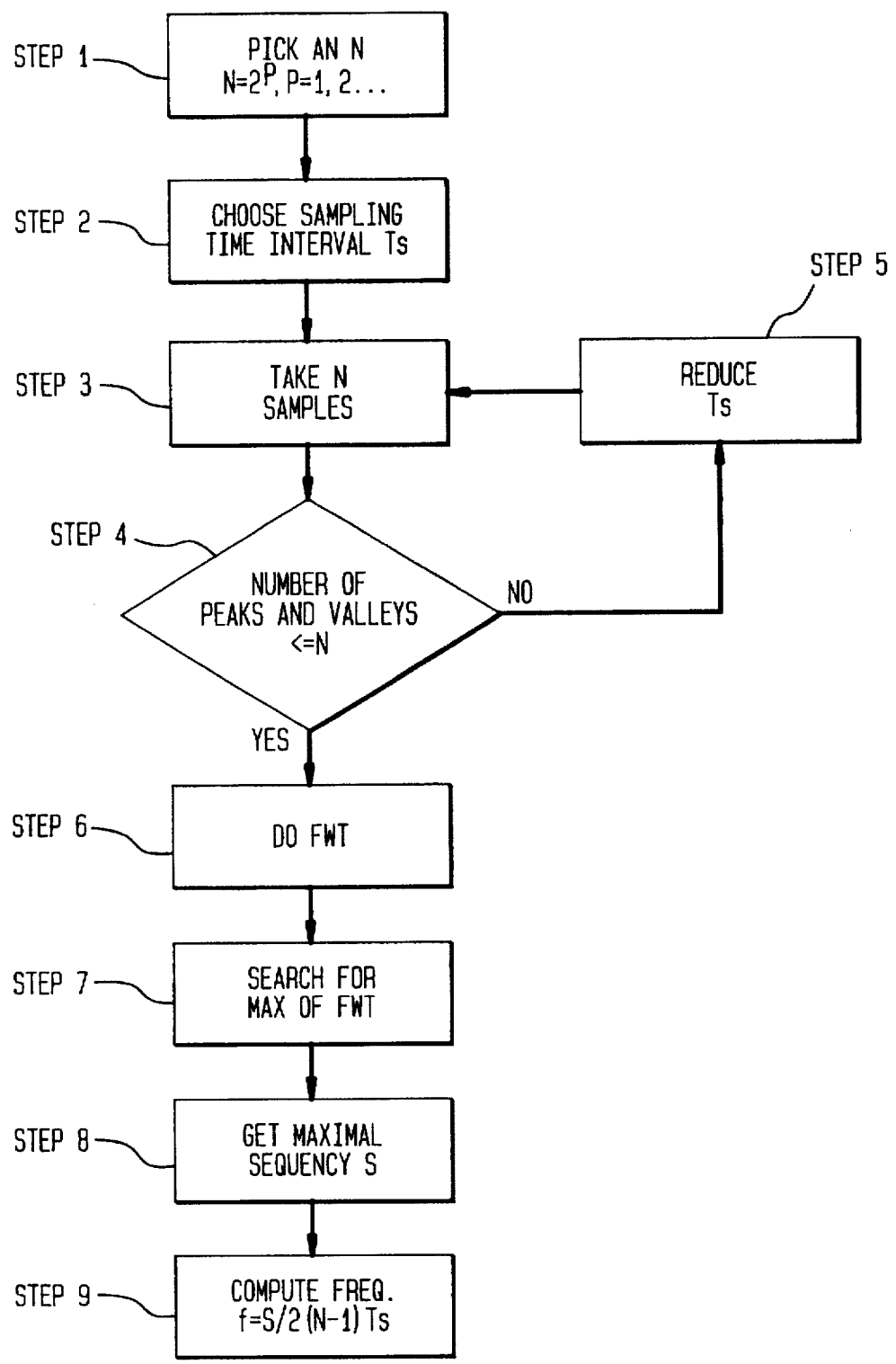
FIG. 3 depicts a flow diagram of the inventive frequency estimation process.

Based on the aforementioned analysis, the present inventive method for frequency estimation of a received signal is outlined in the following procedure, in accordance with the flow diagram of FIG. 3.

Step 1: Pick a value of N, where N=2 raised to the power p, and p=1, 2, 3, 4, . . .

Step 2: Choose sampling interval Ts.

Step 3: Take N samples of the signal of interest.

Step 4: Verify that the number of peaks and valleys contained within the samples is less than or equal to N.

Step 5: If Step 4 is not satisfied, reduce Ts until N is equal to or greater than the number of peaks and valleys.

Step 6: Perform a Fast Walsh Transform of the N samples.

Step 7: Find the maximal value of the FWT samples.

Step 8: Find the sequency(S) of the Walsh function corresponding to this maximal value.

Step 9: Compute frequency (f) from Equation 2:

$$f = \frac{S}{2(N-1)Ts}$$

Figure 4:
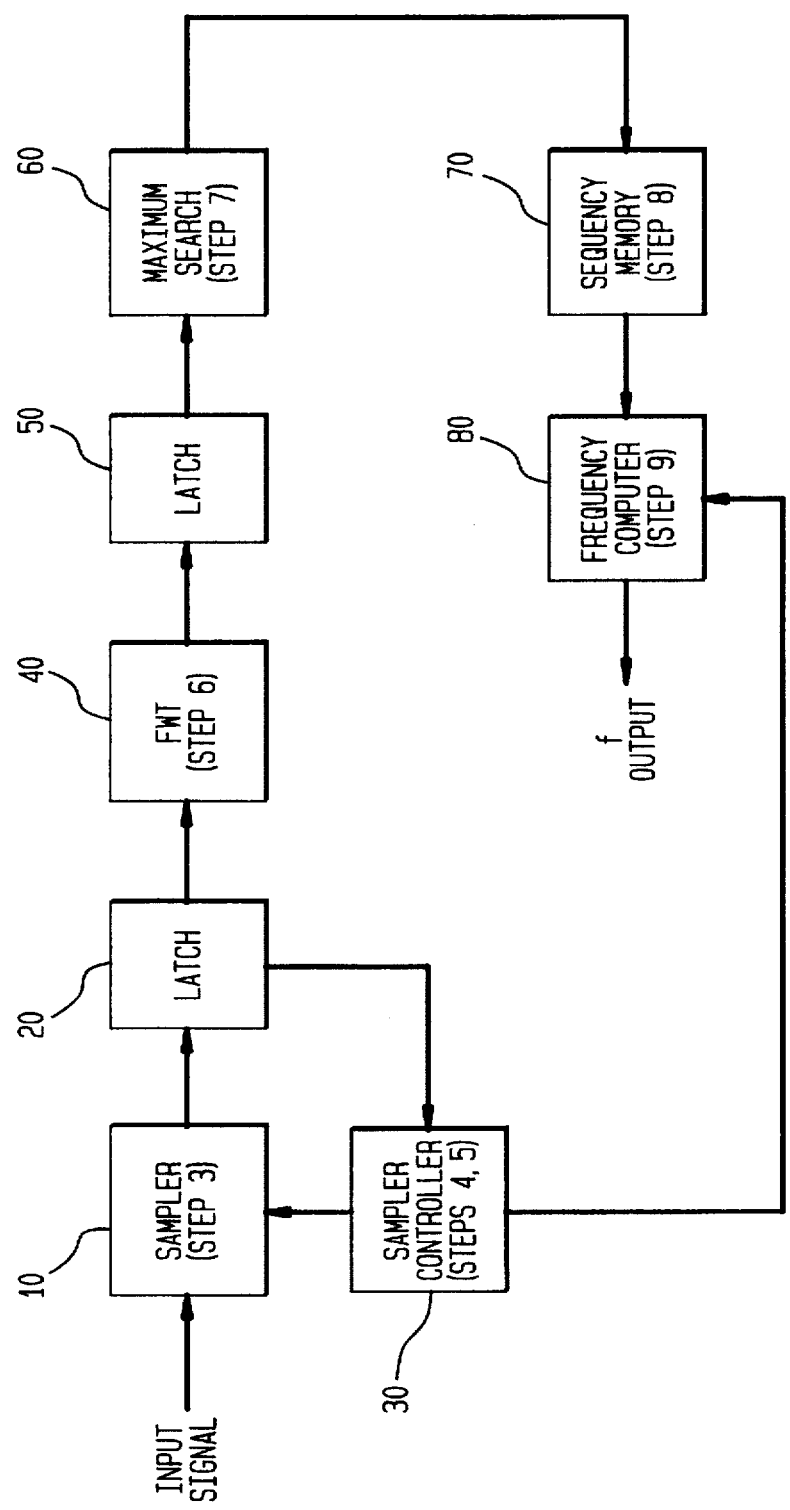
FIG. 4 is a functional block diagram of the inventive frequency estimation circuit.

A block diagram of the circuit for implementing the above described frequency detection process is given in FIG. 4. Each block is labeled with its function, and is referenced to its corresponding step in the above described procedure. The operation of this Frequency Detector Circuit is as follows:

An analog input signal is received at the Sampler 10. The signal is digitized and sampled to obtain N input samples using the sampling interval Ts. These samples are accumulated in Latch 20 and are routed to the Sampler Controller 30. Sampler Controller 30 counts the number of peaks and valleys and compares that number to N. If the number of peaks and valleys is greater than N, time interval Ts is reduced by Sampler Controller 30, and Sampler 10 is directed by Sampler Controller 30 to take a new set of (revised) N samples. This process is repeated until the number of peaks and valleys is less than or equal to N. When this condition is satisfied, the N samples are routed to the FWT circuit 40 via Latch 20. An FWT matrix multiplication is performed and the results are accumulated in Latch 50. These results are then scanned by the Maximum Search circuit 60 to obtain the Walsh transform sample with maximum absolute value. This maximal component is then matched to its corresponding sequency by the Sequency Memory circuit 70, which stores the sequency of different Walsh function. The selected maximal sequency (S) is then applied to the Frequency Computer circuit 80, which also receives the values of N and Ts from Sampler Controller 30. The estimated frequency f is computed by Frequency Computer circuit 80, in accordance with Equation 2. Frequency f is the final output of the Frequency Detector Circuit of FIG. 4.

For a chosen sampling interval Ts, the maximum predictable frequency (fmax) is:

$$fmax = \frac{1}{2Ts} \quad \text{(Equation 3)}$$

which corresponds to sequency S(N−1), from Equation 2 and FIG. 1a.

Also from Equation 2, it can be seen that the sequency (S) limits the resolution (fr) of the estimated frequency to:

$$fr = \frac{1}{2(N-1)Ts} \quad \text{(Equation 4)}$$

Thus, without interpolation, the following is true:

f(actual)=f(estimated) plus/minus fr(resolution)

To improve this resolution (fr), the inventive method heretofore described is enhanced by an interpolative process, described herein as "sequency interpolation". That is, the sequency data derived from the inventive process is mathematically smoothed, resulting in better resolution and accuracy of the estimated frequency. This method of sequency interpolation is described as follows:

From the data acquired in Steps 1 thru 8 above, let (Max 1) equal the maximum Walsh transformed sample, corresponding to a Walsh function with sequency ($S_1$), and let (Max 2) equal the next largest Walsh transformed sample corresponding sequency (S2). Then, the interpolated sequency ($S_i$) becomes:

$$Si = \frac{S_1(Max\ 1)^2 + S_2(Max\ 2)^2}{(Max\ 1)^2 + (Max\ 2)^2} \quad \text{(Equation 5)}$$

In order to illustrate this inventive method of sequency interpolation, examples will be used that result in more than one non-zero value of Y, unlike those of Examples (1) through (4), where only one non-zero value of Y made interpolation unnecessary.

EXAMPLE (5)

Figure 5:
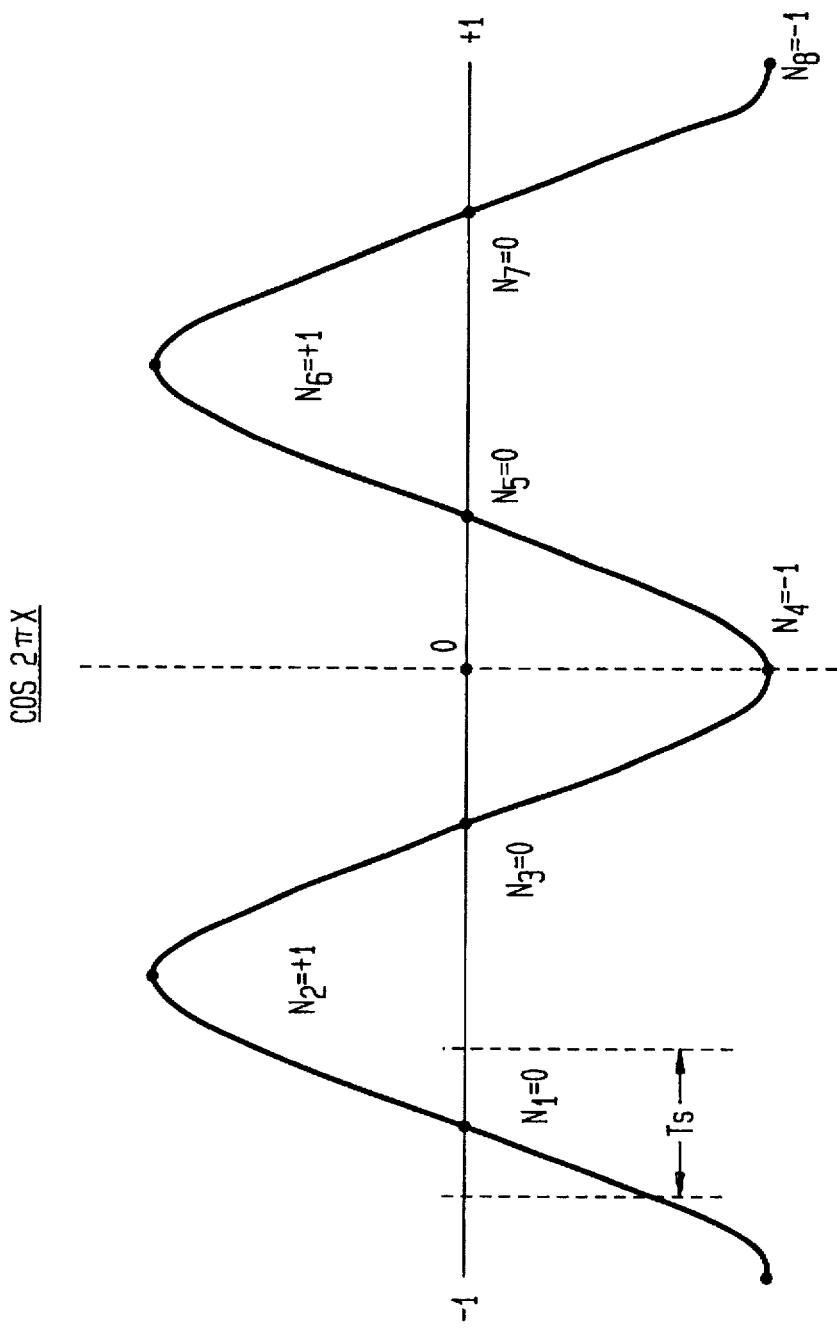
FIG. 5 illustrates the waveform $\cos(2\pi x)$ as related to the interpolative process, in accordance with the invention.

In FIG. 5, let N=8 (step 1) with Ts as shown (step 2). The $\cos(2\pi x)$ waveform has five peaks and valleys. Thus, the number of samples (step 3) satisfies the requirements of steps 4 and 5. The values of these N samples are as follows: $N_1=0$, $N_2=+1$, $N_3=0$, $N_4=-1$, $N_5=0$, $N_6=+1$, $N_7=0$, $N_8=-1$. Performing the FWT matrix multiplication (step 6) yields the following:

$$\begin{bmatrix} Y_1 \\ Y_2 \\ Y_3 \\ Y_4 \\ Y_5 \\ Y_6 \\ Y_7 \\ Y_8 \end{bmatrix} = \begin{bmatrix} 0 \\ 0 \\ 0 \\ 4 \\ -4 \\ 0 \\ 0 \\ 0 \end{bmatrix}$$

The maximal FWT components are ($Y_4=4$) and ($Y_5=-4$), corresponding to Walsh functions sequencies of $S_1=3$ and $S_2=4$, respectively (steps 7 and 8). Then, the interpolated sequency ($S_i$) is found from Equation 5, as follows:

$$Si = \frac{(3)(4*4) + (4)(-4)*(-4)}{32} = 3.5$$

From Equation 2, $$\text{frequency}\ (f) = \frac{S}{2(N-1)Ts} = \frac{3.5}{14Ts} = \frac{1}{4Ts} \quad \text{(step 9)}$$

This is the correct value for (f), as shown in Table 1.

EXAMPLE (6)

Figure 6:
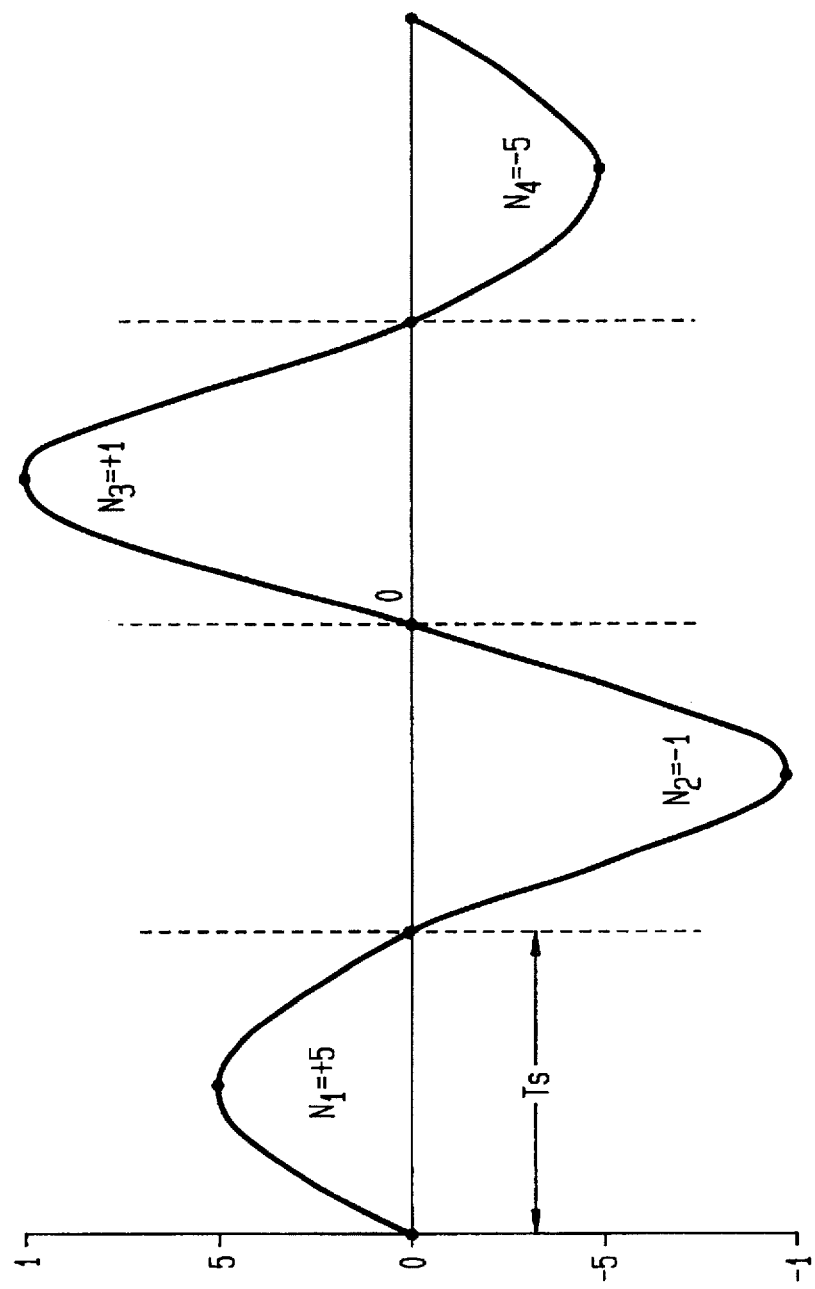
FIG. 6 illustrates a modified $\sin(2\pi x)$ waveform as related to the interpolative process, in accordance with the invention.

In FIG. 6, there are four peaks and valleys, and N=4 samples, again satisfying the conditions of steps 1 through 5. The sample values are: $N_1=+0.5$, $N_2=-1$, $N_3=+1$, $N_5=-0.5$. Performing the FWT matrix multiplication (step 6) yields the following results:

$0=Y_1$
$-1=Y_2$
$0=Y_3$
$3=Y_4$

The maximal FWT components are ($Y_4=3$) and ($Y_2=-1$), corresponding to Walsh functions with sequencies of $S_1=3$ and $S_2=1$, respectively (steps 7 and 8).

The interpolated sequency ($S_i$), from Equation 5, is as follows:

$$S_i = \frac{(3)(3*3) + (1)(-1*-1)}{(3*3) + (-1*-1)} = \frac{(27+1)}{10}$$

$S_i = 2.8$

From Equation 2, $$\text{frequency}\ (f) = \frac{2.8}{6Ts} = \frac{1}{2.1Ts} \quad \text{(step 9)}$$

This result is in close agreement with the equivalent value of a $\sin(2\pi x)$ waveform (½Ts), since the waveform of FIG. 6 is of the same general configuration as $\sin(2\pi x)$.

In summary, the inventive method of frequency estimation described above is based on a linear equation (Equation 2) relating the frequency of a signal to the sequency of the Walsh function resulting in an FWT sample with maximum absolute value. The range of signal frequencies (f) and the required accuracy of estimation determine the sampling rate (Ts) and the dimension (N) of the FWT. Further enhancement of the estimation process is achieved through the use of sequency interpolation, as defined herein (Equation 5). This overall embodiment of frequency estimation and resolution enhancement offers improvement in speed of acquisition and simplicity of implementation over prior techniques.

The above-described embodiment of the inventive method is illustrative only. The full scope of the invention, therefore, should be determined by the following claims.

I claim:

1. A method for identifying an estimate of the frequency of a signal, comprising the steps of:
   (a) receiving an input signal having an unknown frequency,
   (b) obtaining N samples of the signal, using a sampling time interval Ts, said step (b) further comprising the step of insuring that the number of peaks and valleys in the obtained samples is less than N,
   (c) applying a Walsh transform to said samples,
   (d) identifying the single Walsh transformed sample with the maximal absolute value,
   (e) obtaining the sequency S of a Walsh function corresponding to said maximal absolute value, and
   (f) identifying an estimate of said frequency of said signal from said sequency S.

2. The method of claim 1, wherein said frequency is computed using the formula $$f = \frac{S}{2NTs}\ .$$

3. The method of claim 1, wherein said frequency is computed using the formula $$f = \frac{S}{2(N-1)Ts}\ .$$

4. The method of claim 1, wherein said sequency is computed using the formula $$S = \frac{S_1(Max1)^2 + S_2(Max2)^2}{(Max1)^2 + (Max2)^2}$$

where $S_1$=first sequency corresponding to first maximum of Walsh transform samples,
$S_2$=second maximal sequency corresponding to second maximum of Walsh transform samples,
Max1=first maximum of Walsh transform samples,
Max2=second maximum of Walsh transform samples.

* * * * *